United States Patent [19]

Tani et al.

[11] Patent Number: 4,769,560
[45] Date of Patent: Sep. 6, 1988

[54] SEMICONDUCTOR DEVICE HAVING DARLINGTON-CONNECTED TRANSISTOR CIRCUIT

[75] Inventors: Keizo Tani; Junichi Nakao; Eiji Kotani, all of Hyogo, Japan

[73] Assignee: Kabushiki Kaisha Toshiba, Kawasaki, Japan

[21] Appl. No.: 13,793

[22] Filed: Feb. 12, 1987

[30] Foreign Application Priority Data

Mar. 17, 1986 [JP] Japan .................................. 61-56984

[51] Int. Cl.⁴ ...................... H03K 3/33; H03K 17/56; H01L 27/02
[52] U.S. Cl. .................................. 307/315; 307/300; 357/46
[58] Field of Search ............... 307/315, 300, 303, 540; 357/46

[56] References Cited

U.S. PATENT DOCUMENTS 4,482,911 11/1984 Quoirin .................................. 307/315

FOREIGN PATENT DOCUMENTS 0118356 10/1978 Japan .................................. 307/315

OTHER PUBLICATIONS

Transistor-Diodes, "Electronic Data Library-Semiconductors", G. E. Transistor Manual, Chap. 7, Applications, Sec. 7.1.2, pp. 193-198, 1984.

*Primary Examiner*—Stanley D. Miller
*Assistant Examiner*—B. P. Davis
*Attorney, Agent, or Firm*—Finnegan, Henderson, Farabow, Garrett and Dunner

[57] ABSTRACT

An additional p-n junction diode, having a forward bias voltage smaller than a forward bias voltage between the base and emitter of a first-stage specific transistor of 3-stage Darlington connected npn transistors, is electrically connected in parallel between a p-type base layer and an n-type collector layer of the specific transistor. The polarities of the p-type and n-type layers of the diode are respectively the same as those of the parallel-connected p-type base and n-type collector layers of the specific transistor.

11 Claims, 8 Drawing Sheets

F I G. 5
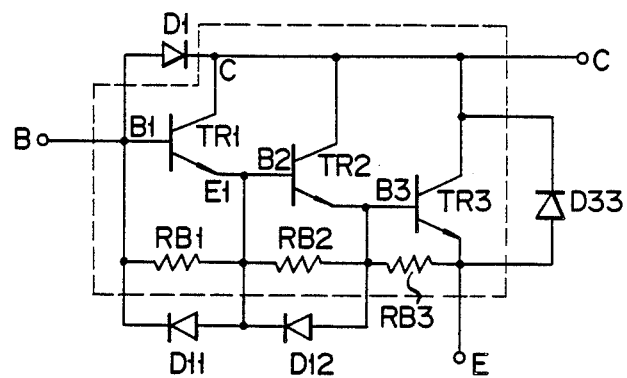
F I G. 6
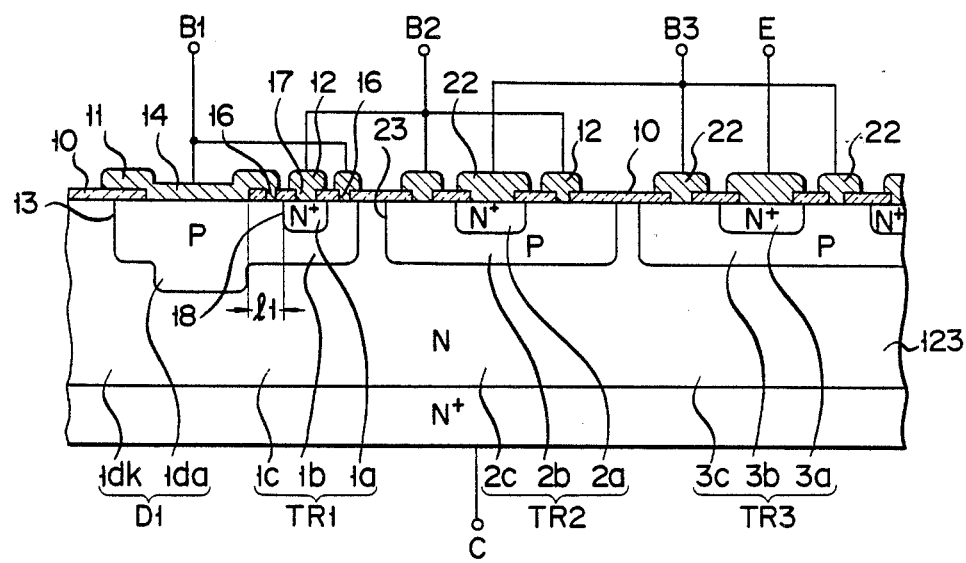

F I G. 11
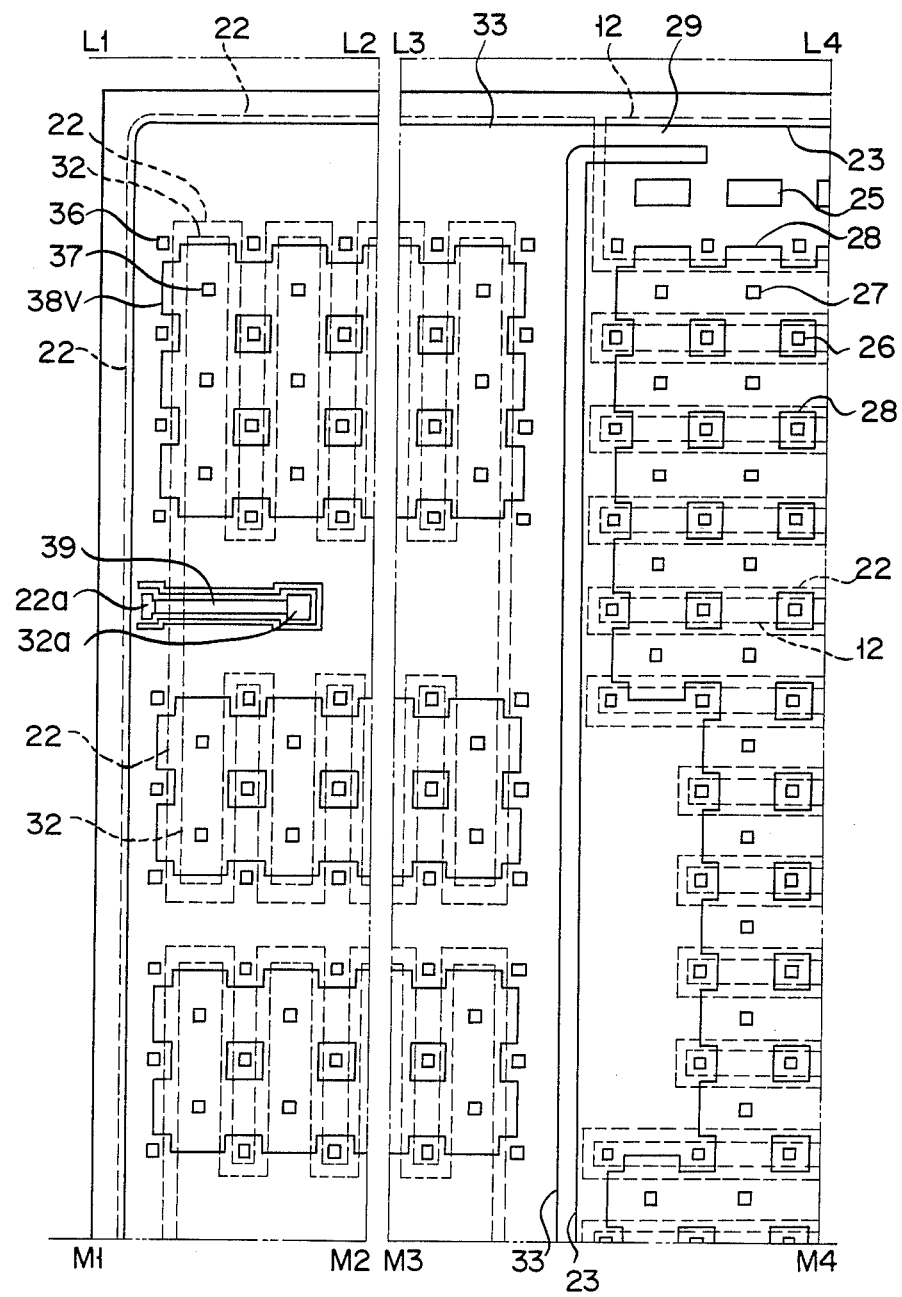

SEMICONDUCTOR DEVICE HAVING DARLINGTON-CONNECTED TRANSISTOR CIRCUIT

BACKGROUND OF THE INVENTION

The present invention relates to a semiconductor device having a transistor circuit with a Darlington structure and, more particularly, to a Darlington transistor circuit in which a p-n junction diode, for obtaining a high speed switching characteristic, is added between the base and collector, and which is particularly used for a switching transistor and a power transistor module product.

A Darlington transistor circuit, which is obtained by cascade-connecting a plurality of transistors, has a very high total current-amplification factor, because the total current-amplification factor is a product of current-amplification factors of respective transistors. When this transistor circuit is used as a switching element for switching a large current, a so-called drive current is reduced very much, so that the Darlington transistor circuit is suitable as a high power transistor. In this case, the high-speed switching characteristic of the Darlington transistor circuit is an important factor for a switching device. Although the switching time of a transistor is determined by various factors, switching-off time (turn-off time) $t_{off}$, consisting of the sum of storage time $t_{stg}$ (a time interval between the end of input pulse and the beginning of change in output pulse) and fall time $t_f$ (a time interval between the beginning and end of change in output pulse) is important. In order to reduce $t_{off}$, the amount of extra minority carriers stored in base and collector regions during an ON state must be set to be a proper value required for maintaining the ON state, and must be rapidly dissipated upon turning off the transistor.

As a conventional technique for obtaining a high-speed characteristic in the transistor, a method of diffusing a carrier lifetime killer such as gold, platinum, or the like into the base region of a semiconductor chip, or performing electron beam irradiation to reduce the lifetime of the carriers at the region, is widely used. However, according to these methods, since the carrier lifetime in the base region is reduced, the linearity of DC current-amplification factor $h_{FE}$ vs. collector current $I_C$ is degraded, or collector-emitter saturation voltage $V_{CE}$ (sat) is increased. (Note that in the case of the $h_{FE}$ vs. $I_C$ characteristic, reducing the maximum peak value of $h_{FE}$ without reducing $h_{FE}$ at a switching point, i.e., maintaining $h_{FE}$ constant with respect to changes in $I_C$, improves the linearity of $h_{FE}$. This allows a reduction in turn-off time $t_{off}$.) For this reason, a large chip size is required to obtain predetermined characteristics in consideration of linearity-degradation of $h_{FE}$. This results in high manufacturing cost and large variations in chip characteristics.

Conventional module products will now be described below.

FIG. 1 shows an equivalent circuit diagram of a high-power module product of a three-stage Darlington transistor circuit. In order to reduce switching-off time $t_{off}$, diode $D_a$ is connected between input terminal B and collector terminal C, and cross-coupled diodes $D_b$ and $D_c$ are connected between input terminal B and base terminal B1 of first-stage transistor TR1. With this arrangement, a forward bias voltage of input terminal B and emitter terminal E1 of the first-stage transistor (having the same potential as that of base terminal B2 of the next-stage transistor) can be increased more than a forward bias voltage of diode $D_a$ connected between terminals B and C. Therefore, since part of the base current flowing from terminal B during the ON state of transistor TR1 is bypassed to diode $D_a$, a current flowing into base terminal B1 of transistor TR1 is reduced, so that oversaturation of transistors TR1–TR3 can be prevented, thereby reducing $t_{off}$.

However, in this method, collector-emitter saturation voltage $V_{CE}$ (sat) of transistor TR3 is increased by an amount corresponding to a forward built-in voltage (about 0.6 V) of diode $D_b$ inserted between terminals B and B1, resulting in increased power loss of the Darlington transistor circuit upon mounting in an actual circuit. On the other hand, in a semiconductor device manufacturing process, an additional three diode chips are required, and strict characteristic control is required for cross-coupled diodes $D_b$ and $D_c$. In addition, the number of assembly steps such as chip mounting or chip bonding increases as the number of chips increases, resulting in high manufacturing cost. Reduction in power loss, obtained by improvement of switching characteristic, is cancelled by the increase in power loss caused by an increase in $V_{CE(sat)}$ ), so that practical advantages, justifying the high manufacturing cost, cannot be obtained.

Recently, in switching semiconductor devices, (a) high withstand voltage, (b) high current gain, and (c) high speed are strong requirements in the market place, but, in relation to semiconductor design, these three characteristics are mutually contradictory. Therefore, products manufactured by conventional techniques cannot satisfy the above-mentioned requirements. For example, when the lifetime of minority carriers in the base is reduced to improve $t_{off}$, as described above, characteristics of $h_{FE}$, such as linearity, are degraded. Further, even if an additional three diodes are used as in the module circuit of FIG. 1, to reduce $t_{off}$, problems such as an increase in $V_{CE}$ (sat) and high manufacturing cost are posed.

SUMMARY OF THE INVENTION

It is accordingly an object of the present invention to provide a semiconductor device which can achieve high-speed switching characteristics (mainly reduction in $t_{off}$) without degrading the transistor characteristics (e.g., withstand voltage, $h_{FE}$ linearity, and $V_{CE\ (sat)}$), and which is compact in size and can be manufactured at low cost.

A semiconductor device having a Darlington structure according to the present invention is characterized in that an additional diode having a forward bias voltage smaller than that between the base and emitter of at least one specific transistor of the Darlington-connected transistors (an NPN transistor will be exemplified below for convenience in description) is electrically connected in parallel between a p-type base layer and an n-type collector layer of the specific transistor, so that the polarities of p-type and n-type layers of the additional diode are the same as those of p-type base and n-type collector layers of the specific transistor, respectively.

Note that the forward bias voltage between the base and emitter of the specific transistor is defined by a voltage drop appearing across the base and emitter thereof when a predetermined base current flows in a forward direction, when in a collector-open state, and that a forward bias voltage of the additional p-n junction diode is defined by a voltage drop appearing across the anode and cathode thereof when the predetermined base current flows through the diode.

The above predetermined base current is determined by trial and error. For example, assume that a minimum DC current amplification factor to be obtained in the semiconductor device having the Darlington structure is $h_{Fe}$, and that a collector current during the measurement of $h_{FE}$ is $I_C$ (usually, $I_C$ is a maximum rated current value). Then, $\alpha I_B$, obtained by multiplying $I_{BR}$, which is calculated by an equation $I_B = (I_C/h_{FE}) \times (1 \text{ to } 2)$ with $\alpha$ ($1 < \alpha < 0$), is determined as the predetermined base current, and $\alpha$ is obtained by trial and error.

It has been experimentally confirmed that switching-off time $t_{off}$ can be reduced by utilizing the above-mentioned additional p-n junction diode. The effect of this additional diode is estimated to be as follows:

When a transistor is in the ON state (staturation state), a base-collector junction of the transistor is forwardly-biased by carriers stored near the junction. This forward bias voltage is smaller than that between the base and emitter. Since the forward bias voltage of the additional p-n junction diode is below that between the base and emitter, and is connected in the same polarity as that of the base-collector junction, the additional p-n junction diode can be rendered conductive by this forward bias voltage, and part of the input base current is bypassed to this diode. Thus, the base current of the transistor is reduced. (In other words, the forward bias voltage of the base-collector junction is substantially fixed at that of the additional p-n junction diode). For this reason, oversaturation of the transistor is prevented, and the amount of the carriers stored in the transistor becomes a proper value. Since the additional p-n junction diode serves to control the stored carrier amount to be a proper value, the time required for dissipating these carriers can be reduced, to thereby obtain a reduction in $t_{off}$.

According to the structure of the present invention described above, unlike conventional structures, the $h_{FE}$ linearity characteristic is not significantly degraded. As a result, a transistor with high speed and high current gain can be obtained. In addition, when the present invention is adapted, transistors of respective stages of the Darlington structure and the additional p-n junction diode can be integrated in a single semiconductor substrate, resulting in a compact and inexpensive semiconductor device.

BRIEF DESCRIPTION OF THE DRAWINGS

FIG. 5 is an equivalent circuit diagram according to a first embodiment of the present invention;

FIG. 6 is a cross-sectional view of a semiconductor device including a transistor circuit, according to a second embodiment of the present invention;

FIG. 11 is another partially enlarged view of FIG. 9; and

DETAILED DESCRIPTION OF THE PREFERRED EMBODIMENTS

First, various experiments (in the case of a silicon type) conducted to achieve the present invention will be described below.

Figure 2:
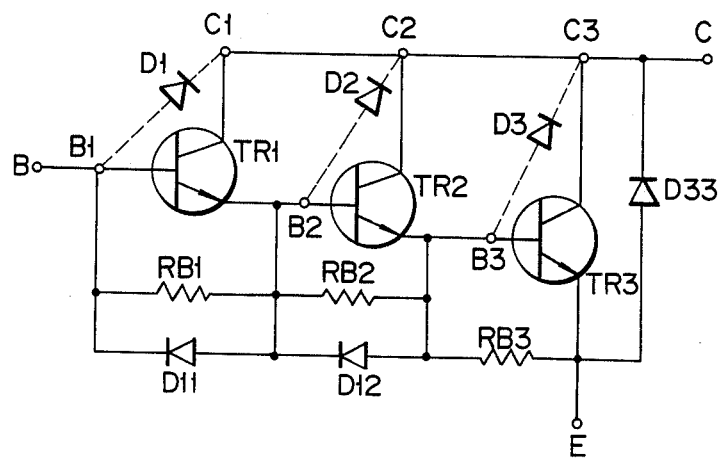
FIG. 2 is an equivalent circuit diagram of a basic experimental circuit of the present invention.

FIG. 2 shows an equivalent circuit diagram of a semiconductor device incorporating a transistor circuit having a 3-stage Darlington structure. Reference numerals TR1, TR2, and TR3 respectively denote first-, second-, and last-stage transistors. The emitter area ratio of TR1, TR2, and TR3 is substantially 1:3:9. Reference numerals D1, D2, and D3 denote additional p-n junction diodes connected between base and collector terminals of first-, second-, and last-stage transistors TR1, TR2, and TR3, respectively. Diodes having various anode areas were prepared for D1 to D3, and were connected or disconnected in accordance with experimental conditions. Resistors RB1 to RB3 are respectively connected between the base and emitter of transistors TR1 to TR3, and speed-up diodes D11 and D12, each for dissipating the storage carriers of each of transistors TR1 and TR2, respectively connected in parallel between the base and emitter. In addition, free wheel diode D33 is connected in parallel between the collector and emitter of transistor TR3, and is activated when transistors TR1–TR3 are turned off.

An input current of $\pm I_B = (I_C/h_{FE}) \times (1 \text{ to } 2)$, with respect to minimum DC current amplification factor $h_{FE}$ to be guaranteed for a conventional 3-stage Darlington element, is supplied to input terminal B. Note that collector current $I_C$ flows to output terminal C, during measurement of the guaranteed $h_{FE}$, and is usually a maximum-rated current value. The characteristics to be measured are switching-off time $t_{off}$ (which is also called a "turn-off time"), $h_{FE}$, and the like, of the 3-stage Darlington element.

Note that base current $I_B/2$ ($\alpha = \frac{1}{2}$ in the aforementioned $\alpha I_B$) is supplied, in advance, to the base-emitter circuit (with collector open) of each of transistors TR1, TR2, TR3, and that respective forward bias voltages TR1·$V_{BEF}$, TR2·$V_{BEF}$, and TR3·$V_{BEF}$ are measured (a forward bias voltage between the base and emitter of nth-stage transistor will be abbreviated as TRn·$V_{BEF}$ hereinafter). In addition, a diode current equal to $I_B/2$ is supplied to the diodes having various anode areas, and respective forward bias voltages $D \cdot V_F$ are measured (a forward voltage of an additional p-n junction diode inserted in an nth stage will be abbreviated as $D_n \cdot V_F$ hereinafter).

EXPERIMENT (a)

An additional diode (D1) is connected only in the first-stage of the circuit of FIG. 2, one of the diodes having various forward bias voltages (V1 to V5) is used as additional diode (D1), and the value of $t_{off}$ is measured for each forward bias voltage. Then, a significant relationship can be found between forward bias voltage $D1 \cdot V_F$ of the diode, forward bias voltage $TR1 \cdot V_{BEF}$ between the base and emitter of the first-stage transistor TR1, and $t_{off}$.

Figure 3:
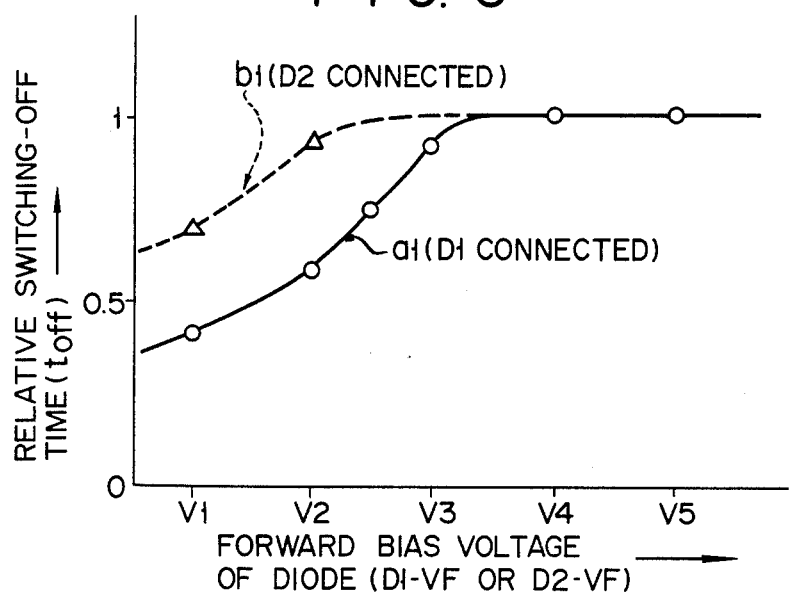
FIG. 3 is a graph showing how switching-off time ($t_{off}$) of the 3-stage Darlington circuit in FIG. 2 changes with respect to a forward bias voltage ($V_F$) of each of diodes (D1, D2), shown in FIG. 2, as compared with the circuit of FIG. 1, in which solid curve a1 shows a case when only diode D1 is used, broken curve b1 showing a case when only diode D2 is used.

The result of the measurement is shown in FIG. 3. The x-axis shows a value of forward bias voltage $D1 \cdot V_F$ (or $D2 \cdot V_F$) of the diode, and the y-axis shows relative $t_{off}$ when $t_{off}$ of the 3-stage Darlington transistor circuit, not being provided with additional diode D1, is 1. In addition, when V1 to V5 are represented by $V_{BEF}$ of each transistor, $V1 = TR3 \cdot V_{BEF}$, $V2 = TR2 \cdot V_{BEF}$, $V3 = TR1 \cdot V_{BEF}$, $V4 = TR1 \cdot V_{BEF} + TR2 \cdot V_{BEF}$, and $V5 = TR1 \cdot V_{BEF} + TR2 \cdot V_{BEF} + TR3 \cdot V_{BEF}$. The result of this experiment is shown by solid curve a1. $V3 = TR1 \cdot V_{BEF} = D1 \cdot V_F$ (100% on x-axis in FIG. 4) is a critical point at which $t_{off}$ of the 3-stage Darlington transistor circuit starts to be reduced at first, and is then significantly reduced as $D1 \cdot V_F$ is further reduced, as compared with V3 or $TR1 \cdot V_{BEF}$.

However, when $D1 \cdot V_F$ is reduced too much, the chip size of diode D1 must inevitably be enlarged. As a result, when transistor TR1 is turned on/off, a transient current ($C_j \times dv/dt$ current) flowing through p-n junction capacity $C_j$ of diode D1 is increased, frequently resulting in the destruction of diode D1. Further, since part of input base current $I_B$ from terminal B does not flow into TR1, but is bypassed to D1, $h_{FE}$ of the 3-stage Darlington transistor circuit is reduced and $V_{CE\,(sat)}$ is increased.

Figure 4:
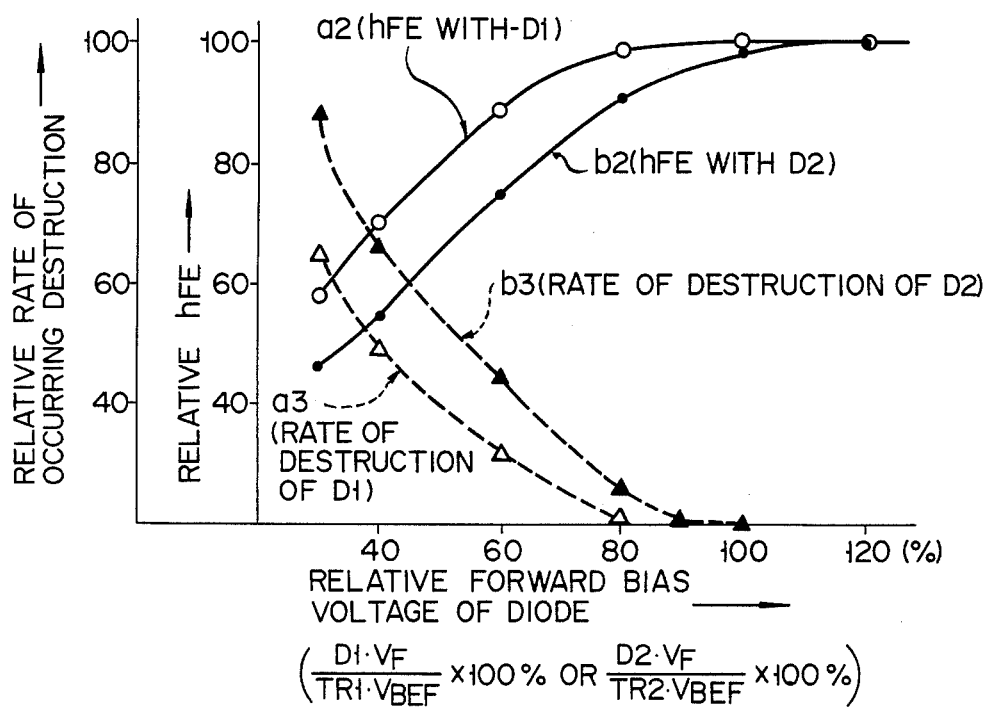
FIG. 4 is a graph showing how the DC current-amplification factor ($h_{FE}$) of the Darlington circuit changes (solid curves a2 and b2) with respect to the relative forward bias voltage (%) of the diode, as compared with the circuit shown in FIG. 1, when the forward bias voltage ($V_F$) of the diode (D1, D2) is normalized by the forward base-emitter voltage ($V_{BEF}$) of a transistor (TR1, TR2) of the Darlington circuit, and how the rate of destruction (%) of the diode (D1, D2) changes (broken curves a3 and b3) with respect to the relative forward bias voltage (%)

FIG. 4 shows a relationship between $h_{FE}$ vs. $D1 \cdot V_F$ and the rate of destruction vs. $D1 \cdot V_F$. The x-axis shows a value of $D1 \cdot V_F / TR1 \cdot V_{BEF} \times 100\%$, and the y-axis shows a relative value of $h_{FE}$ of the 3-stage Darlington transistor circuit when a value of $h_{FE}$ of the transistor circuit, not being connected to D1, is assumed to be 100%, and the rate of destruction (%) of the diode. Solid curve a2 shows a relationship between relative $h_{FE}$ and $D1\,V_F / TR1 \cdot V_{BEF}$, and broken curve a3 shows a relationship between the rate of destruction of diode D1 and $D1 \cdot V_F / TR1 \cdot V_{BEF}$. Thus, an optimal value of $D1 \cdot V_F$ is found to be 80 to 100% of $TR1 \cdot V_{BEF}$.

EXPERIMENT (b)

An additional diode (D2) is connected between the base and collector (B2—C2) of only the second-stage transistor, and an experiment similar to experiment (a) is performed. A relationship between $t_{off}$ and $D2 \cdot V_F$ is shown by broken curve b1 in FIG. 3, and a relationship between relative $h_{FE}$, the rate of destruction, and $D2 \cdot V_F / TR2 \cdot V_{BEF}$ is shown by solid curve b2 and broken curve b3 in FIG. 4. When diode D2, corresponding to the $TR2 \cdot V_{BEF} \geq D2 \cdot V_F$ condition (below 100% of x-axis in FIG. 4), is connected between terminals B2 and C2 of transistor TR2, $t_{off}$ of the 3-stage Darlington transistor circuit is reduced, as in the case of experiment (a) (broken curve b1 in FIG. 3). However, the amount of reduction in $t_{off}$ is smaller than that in experiment (a). On the other hand, since diode D2, having a large capacitance is required, in order to reduce $D2 \cdot V_F$ below $TR2 \cdot V_{BEF}$, $h_{FE}$ is reduced and the rate of destruction of diode D2 is degraded (solid curve b2 and broken curve b3 in FIG. 4). In this circuit condition, the effective value of $D2 \cdot V_F$ is 90 to 100% that of TR2 $V_{BEF}$.

EXPERIMENT (c)

An additional diode (D3) is connected between the base and collector (B3-C3) of only the last-stage transistor, and an experiment similar to those in (a) and (b) is performed. Although $t_{off}$ of the 3-stage Darlington transistor circuit is reduced, a diode D3 with a larger chip than that in the experiment (b) is required. This is in conflict with the need for a reduction in manufacturing cost. In addition, the rate of destruction of diode D3 and transistor TR3 circuit increases significantly, so that the area of safe operation in forward and reverse biasing directions, guaranteed by the 3-stage Darlington transistor circuit, is significantly narrowed down, thus, resulting in practical inconvenience.

EXPERIMENT (d)

Additional diodes (D1, D2) are respectively connected between the base and collector (B1-C1, B2-C2), of the first- and second-stage transistors, at the same time, and an experiment similar to the previous examples, is conducted. As can be expected, based on experiments (a) and (b), the reduction in $t_{off}$ is larger than the result of either of the above-mentioned prior experiments, because experiment (d) can have a combination effect obtained by using diodes D1 and D2. However, since large and small chips are required for additional diodes D1 and D2, whether or not the experiment (d) is to be reduced to practice must be examined in consideration of an even balance between the effect of an improvement in circuit characteristic and an increase in chip size, in terms of a commercial project. However, when diodes D1 and D2 are incorporated in the 3-stage Darlington transistor chip, or are applied to a low voltage-rating 2-stage Darlington transistor circuit, the above disadvantage (increase in chip size) is reduced, and experiment (d) then becomes an effective technique.

Embodiments of a semiconductor device according to the present invention, manufactured in accordance with the above-mentioned experimental results, will now be described below.

FIG. 5 shows an equivalent circuit diagram of a 3-stage Darlington transistor circuit according to a first embodiment of the present invention. In this embodiment, additional diode D1 is connected between the base and collector of first-stage transistor TR1 only. In FIG. 5, the Darlington transistor circuit encircled by the broken line is formed as a semiconductor element, having a rating of 1,200 V and 50 A, in one chip semiconductor substrate of, for example, $15 \times 15$ mm$^2$. At this time, $TR1 \cdot V_{BEF}$ of first-stage transistor TR1 is 0.8 to 0.82 (V), under the condition of $I_B = 0.5$ A, at room temperature (25° C.). Therefore, serving as diode D1 to be connected between the base and collector of TR1, is a diode using a $3.5 \times 3.5$ mm$^2$ chip and having $D1 \cdot V_F = 0.68$ to 0.70 (V) (about 85% of $TR1 \cdot V_{BEF}$), at room temperature, when a diode forward current is 0.5 A.

The Darlington transistor chip and the diode chip are mounted on and bonded to a single wiring base, and the assemblied product is measured. $T_{off}$ of the product is 15 μs. As compared with $t_{off}$ 20 μs obtained when only the 3-stage Darlington transistor circuit is used, the product of the present invention can reduce the switching-off time by 5 μs. In addition, when the product of the present invention (with D1) is compared with a conventional product (without D1), in terms of other characteristics, the $h_{FE}$ linearity and the $V_{CE(sat)}$ vs. $I_C$ characteristic remain the same. In addition, regarding the $V_{CE(sat)}$ vs. $I_B$ characteristic, $V_{CE(sat)}$ in the product of the present invention is increased by about 50 (mV) under the same $I_B$ condition as in the prior art 3-stage Darlington transistor circuit, but such a small increase can be practically negligible. It is a matter of course that substantially no difference is found between the present invention and the prior art with respect to the area of safe operations in the forward direction and in the reverse direction (in which the transistor is operated with the polarity of $V_{CE}$ being opposite to that in the forward direction) of the 3-stage Darlington transistor circuit itself.

Figure 1:
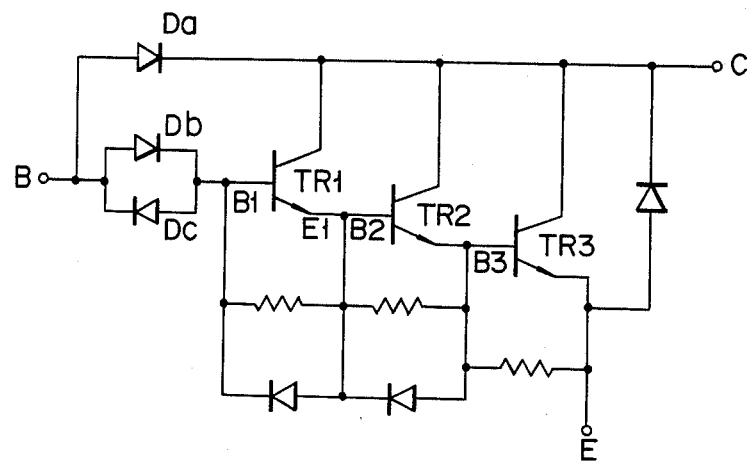
FIG. 1 is an equivalent circuit diagram of a conventional 3-stage Darlington-connected transistor circuit.

For the purpose of comparison, a 3-stage Darlington transistor circuit having a conventional structure, shown in FIG. 1, was manufactured. This 3-stage Darlington transistor circuit was formed in a 15×15 mm² chip of the same lot as that of the present invention to be compared therewith, and diode $D_a$, to be inserted between the base and collector of first-stage transistor TRI, was also formed in a 3.5×3.5 mm² chip of the same lot as that of diode D1. A 2×2 mm² chip was used for forming two bidirectional diodes $D_b$ and $D_c$ to be inserted between input and base terminals B and B1. $T_{off}$ of the 3-stage Darlington transistor circuit of FIG. 1 is 14.8 μs, under the same measurement condition as that of FIG. 5. The difference is only 0.2 μs as compared with the product of FIG. 5. However, as compared with the product of FIG. 5, the rise point of $V_{CE(sat)}$ of the FIG. 1 circuit is degraded by 0.6 (V), like other conventional products.

FIG. 6 shows a cross-section of a semiconductor device incorporating a transistor circuit according to a second embodiment of the present invention. In the second embodiment, additional diode D1 in the first embodiment is incorporated or integrated in the 3-stage Darlington transistor chip. (An equivalent circuit diagram of this Darlington transistor circuit is the same as that in FIG. 5).

In FIG. 6, first-stage transistor TR1 includes n+-type emitter layer 1a, p-type base layer 1b, and n-type collector layer 1c. Second-stage transistor TR2 includes n+-type emitter layer 2a, p-type base layer 2b, and n-type collector layer 2c. Third-stage transistor TR3 includes n+-type emitter layer 3a, p-type base layer 3b, and n-type collector electrode 3c. Layer 1a of transistor TR1 is electrically connected to layer 2b of transistor TR2, through aluminum wiring (electrode) 12, and layer 2a of transistor TR2 is electrically connected to layer 3b of transistor TR3, through aluminum wiring (electrode) 22, thereby forming a so-called Darlington structure.

Diode D1 includes p-type anode layer 1da and n-type cathode layer 1dk. Layer 1da commonly occupies part of layer 1b of transistor TR1. Layers 1c, 2c, and 3c of respective transistors, and layer 1dk of diode D1 from n-type semiconductor layer 123, and they are electrically connected one another. The p-type layer of diode D1 is electrically connected directly, or via aluminum wiring (electrode) 11, to layer 1b of transistor TR1.

Therefore, diode D1 is electrically connected in parallel between the base and collector of transistor TR1, so as for D1 and TR1 to have the same polarities. (Namely, p- and n-type layers of D1 are connected to p- and n-type layers of TR1, respectively.) Note that reference numeral 10 denotes an insulating interlayer; 13, a base-collector junction surface of TR1 or a junction surface of D1; 14, an anode contact hole of D1; 16, a base contact hole of TR1; 17, an emitter contact hole of TR1; and 18, an emitter-base junction surface.

Figure 7:
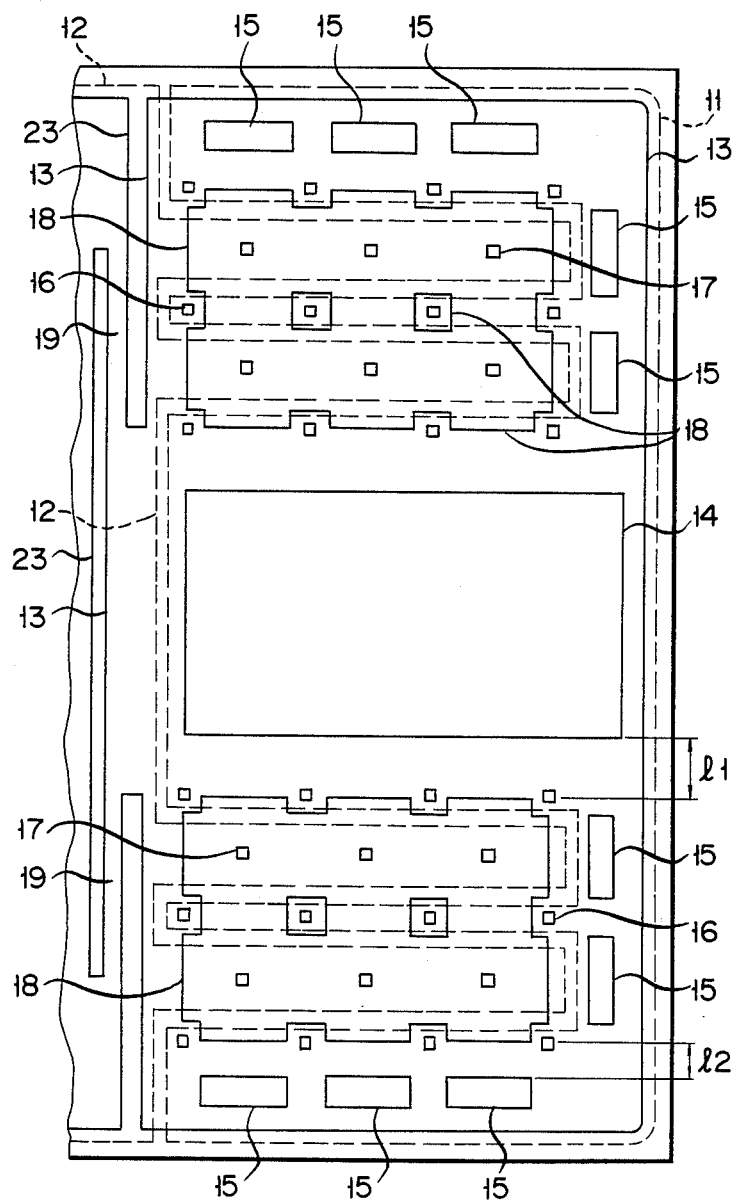
FIG. 7 is a partial plan view of the semiconductor device of FIG. 6.

FIG. 7 is a schematic plan view of transistor TR1. In FIG. 7, a semiconductor chip is illustrated in a vertical perspective, and only the outlines of each part are shown. The corresponding parts in FIG. 6 are denoted by corresponding reference numerals in FIG. 7. For example, broken line 11 denotes the end of the base aluminum wiring of TR1 (commonly used as the anode aluminum wiring of D1), broken line 12 denotes the end of the emitter aluminum wiring of TR1 (commonly used as the base aluminum wiring of TR2), and solid line 15 denotes a supplementary anode contact hole of D1. However, reference numeral 19 denotes base resistor $R_{B1}$ for connecting layer 1b of TR1 to layer 2b of TR2. Note that insulating interlayer 10 in FIG. 6 is not shown in FIG. 7, because interlayer 10 is provided between the aluminum wiring and the substrate surface, and is applied on the entire surface of the substrate of FIG. 7, except for each contact hole thereof. In addition, since schematic plan views of TR1 and TR2 are similar to FIGS. 10 and 11, according to a third embodiment to be described later, a description thereof will be omitted here.

In FIG. 7, the ratio of emitter areas of transistors TR1, TR2, and TR3 is designed to be substantially 1:3:9, and the emitter is formed to have a mesh structure, so that the values of $V_{BEF}$ of the transistors do not become greatly increased. Therefore, a base contact hole can be formed smaller in size than that of a conventional comb emitter structure.

Generally, a forward bias voltage in a diode or between the base and emitter of a transistor in a large-current region largely depends on a voltage drop in an internal resistance. Therefore, the forward bias voltage can be adjusted by the value of the internal resistance (=aluminum bonding length resistance $R_A$+ aluminum deposited wiring length resistance $R_B$+ aluminum electrode contact resistance $R_C$+ p-type electrode diffusion internal resistance $R_D$+ n-type layer diffusion internal resistance $R_E$). Note that $R_A$ or $R_E$ can be changed to obtain the relation TR1·$V_{BEF}$ ≧ D1·$V_F$.

A p-type base layer, situated immediately below a base aluminum bonding pad of transistor TR1, is utilized as diode D1, in order to minimize resistance $R_B$. At this time, it is important to separate anode contact hole 14 of diode D1 from the base-emitter junction of specific transistor TR1, by 50 μm or more, i.e., a diffusion distance necessary for dissipating minority carriers implanted from emitter layer 1a to base layer 1b, must be provided ($l_1$, $l_2$ > 50 μm in the case of FIGS. 6 and 7). This is because it was found, during the experiment, that if hole 14 is not separated from the base-emitter junction, by 50 μm or more, it serves not as an anode electrode of the diode but as a base electrode of transistor TR1.

In addition, the total area of hole 16 of transistor TR1 may be formed 1/10 to ⅓ that of hole 14 of diode D1, to make the junction area of diode D1 small.

Note that when a sufficient potential difference (TR1·$V_{BEF}$−D1·$V_F$) cannot be obtained through adjustment of only $R_B$ and $R_C$, the diffusion depth of layer 1da, immediately below hole 14 of diode D1, may be made 10 to 20 μm deeper than that of electrode 1b of transistor TR1. Supplementary anode contact hole 15 (FIG. 7), provided independently of base contact hole 16, and formed on p-type base layer 1b which is not serving as a transistor, and spaced more than 50 μm apart from emitter-base junction 18 of transistor TR1, has electrically the same function as that of hole 14 of diode D1. When $t_{off}$ of the 3-stage Darlington transistor circuit, incorporating the above additional diode (D1), is measured under the same conditions as those of the first embodiment of FIG. 5, a good result, i.e. $t_{off}$=16.5 μs, is obtained. In addition, other electrical characteristics are not degraded.

As a third embodiment, a one-chip 3-stage Darlington transistor circuit, incorporating additional diodes D1 and D2, will now be described below. FIGS. 8 to 12 are views for explaining the third embodiment, and the same or corresponding parts as in FIGS. 5 to 7 are denoted by the same reference numerals in FIGS. 8 to 12.

Figure 8:
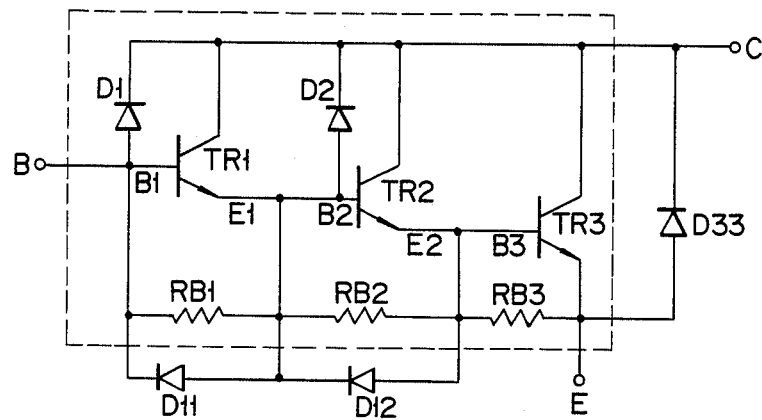
FIG. 8 is an equivalent circuit diagram of a transistor circuit according to a third embodiment of the present invention.
Figure 9:
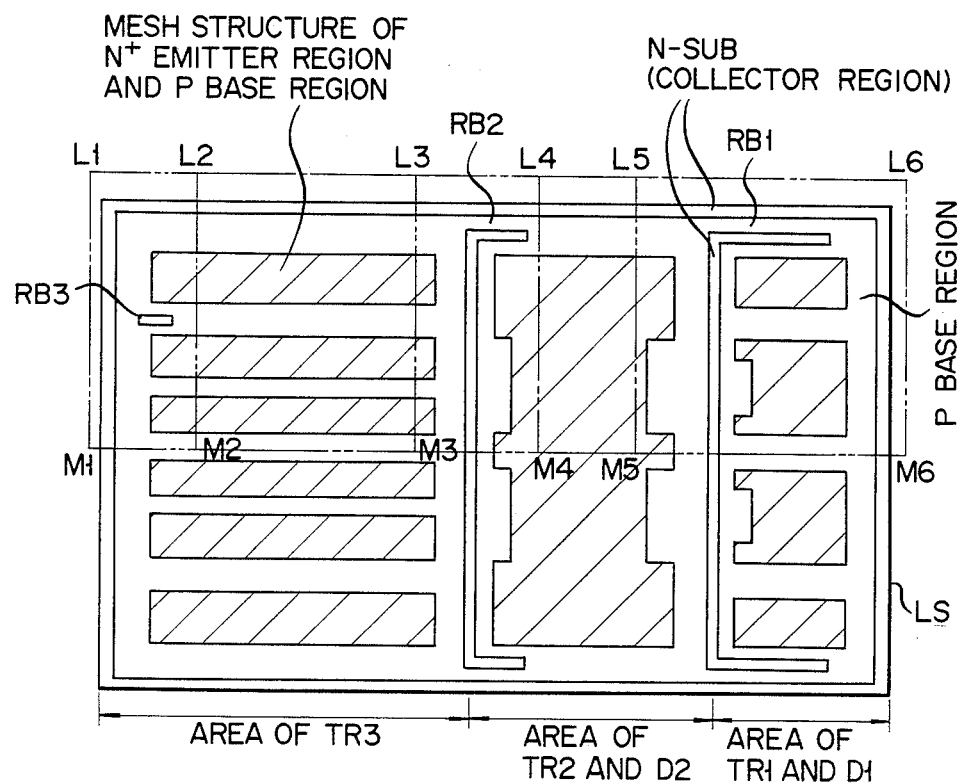
FIG. 9 is a schematic view of a substrate surface of a semiconductor device containing the circuit of FIG. 8.

FIG. 8 shows an equivalent circuit diagram of this transistor circuit. A portion encircled by a broken line is formed in a single semiconductor substrate. FIG. 9 is a plan view of an exposed surface of the substrate, except aluminum wiring and an insulating interlayer, showing the total arrangement of an enlarged plan portion to be described later. In FIG. 9, a region encircled by thick solid line LS is an exposed surface of an impurity diffusion layer, and a solid line in this region indicates a junction surface end curve of the impurity diffusion layer. Portions with slanted lines are mesh structure portions in which mesh-like n+-type emitter layers are formed in p-type base layers.

Figure 10:
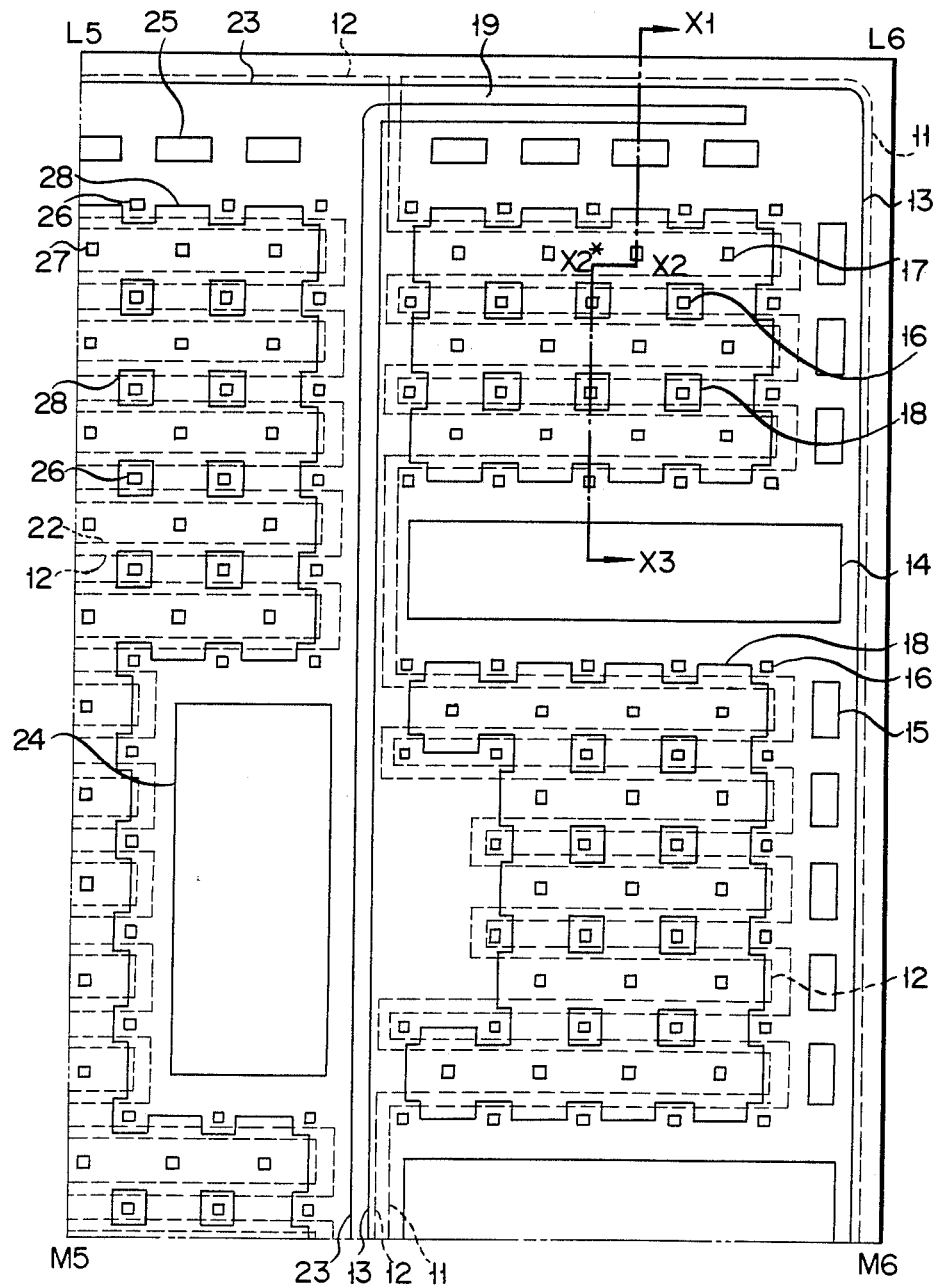
FIG. 10 is a partially enlarged view of FIG. 9.

FIG. 10 is a partially enlarged perspective plan view of the TR1 and D1 regions and the TR2 and D2 regions encircled by rectangles L5, M5, L6, and M6, and corresponding to the second embodiment, shown in FIG. 6. FIG. 11 is a partially enlarged perspective plan view in which rectangles L2, M2, M3, and L3, corresponding to middle portions of rectangles L1, M1, M4, and L4, are cut away.

In FIGS. 10 and 11, broken lines indicate end lines of aluminum wiring. Reference numeral 11 denotes end lines of aluminum wiring of a base electrode of TR1 and an anode electrode of D1; 12, an emitter electrode of TR1, a base electrode of TR2, and an anode electrode of D2; 22, an emitter electrode of TR2 and a base electrode of TR3; and 32, an emitter electrode of TR3. Reference numerals 13, 23, and 33 respectively denote end lines of base-collector junction surfaces of TR1, TR2, and TR3 or the surface of each junction of D1 and D2. Reference numerals 14 and 24 respectively denote anode contact holes of D1 and D2; 15 and 25, supplementary anode contact holes of D1 and D2; 16, 26, and 36, base contact holes of TR1, TR2, and TR3; 17, 27, and 37, emitter contact holes of TR1, TR2, and TR3; 18, 28, and 38, end lines of the base-emitter junction surfaces of TR1, TR2, and TR3; and 19, 29, and 39, $R_{B1}$, $R_{B2}$, and $R_{B3}$ (see FIG. 8). Reference numerals 22a and 32a respectively denote base contact and emitter contact holes of $R_{B3}$.

Anode contact holes 14 and 24 and supplementary anode contact holes 15 and 25 of D1 and D2 are spaced 70 μm apart from the base-emitter junctions of TR1 and TR2, so as not to operate as base contact electrodes thereof. In order to obtain TR1·$V_{BEF}$≧D1·$V_F$ and TR2·$V_{BEF}$≧D2·$V_F$, the total anode contact hole areas of D1 and D2 are much larger than the total base contact hole areas of TR1 and TR2, respectively.

Figure 12:
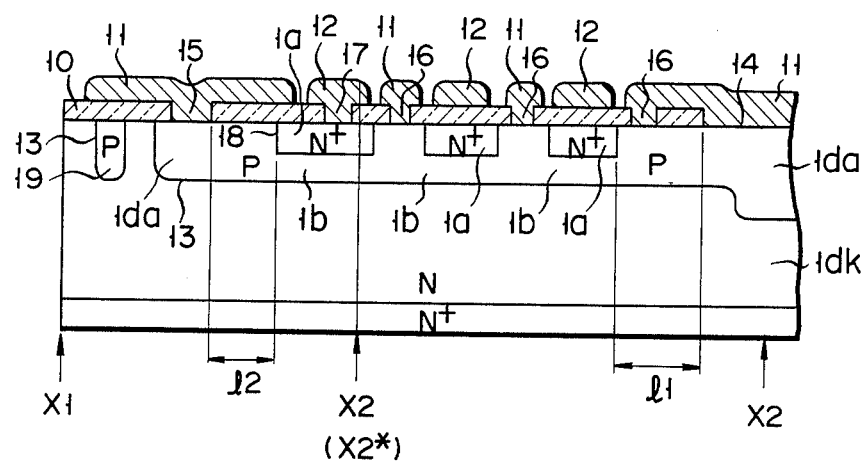
FIG. 12 is a cross-sectional view of a semiconductor device including the circuit of FIG. 8, taken along curve X1-X2-X3 in FIG. 10.

FIG. 12 is a partial cross-sectional view cut vertically with respect to the substrate including lines $X_1$-$X_2$ and $X_2^*$-$X_3$. In FIG. 12, $l_1$ and $l_2$ are distances from holes 14 and 15 of D1 to base-emitter junction 18 of TR1, respectively. As in the case of FIGS. 6 and 7, $l_1$ and $l_2$ must be more than 50 μm.

Description has been made with reference to embodiments of the 3-stage Darlington transistor circuit, but the same result can be obtained by applying the present invention to transistors having 2-stage and 4-or more stage Darlington structures.

In the semiconductor device including a transistor circuit having the Darlington structure according to the present invention, by adding a diode (D1) with forward bias voltage $V_F$ smaller than $V_{BEF}$ of a specific transistor (TR1), switching-off time $t_{off}$ can be reduced without degrading the main characteristics, such as the $h_{FE}$ linearity and $V_{CE(sat)}$. In addition, this circuit arrangement can be very simple thereby reducing the number of chips and assembly steps, and improving the reliability of the device. In particular, additional diodes and transistors can be formed in a single chip, resulting in a compact and inexpensive semiconductor device.

Incidentally, any type of diode (e.g., Schottky barrier diode) can be used for additional diode D1, D2, or D3, provided that $V_{CBO}$≦$V_Z$, where $V_{CBO}$ denotes the base-collector with standing voltage of TR1, TR2, or TR3, and $V_Z$ denotes the reverse-biased withstanding voltage of D1, D2, or D3.

What is claimed is:

1. A semiconductor device having transistors of a Darlington structure in which an emitter layer of one of said transistors used for a previous stage of the Darlington structure is electrically and subsequently connected to a base layer of another one of said transistors used for a next stage thereof, and collector layers of said transistors are electrically connected to a circuit of the same potential, said semiconductor device comprising an additional diode having a forward bias voltage not exceeding a forward bias voltage between the base and emitter of at least one specific transistor of said transistors, which is connected in parallel between a base layer and a collector layer of said specific transistor, so that a current-conducting direction of said additional diode is the same as that of a p-n junction formed by said base layer and said collector layer of said specific transistor and wherein said transistors and said additional diode are formed in a single semiconductor substrate, collector layers of said transistors and said additional diode form a single semiconductor layer of the same conductivity type, at least one contact hole for said additional diode is provided on a portion on said base layer of said specific transistor, in addition to a base contact hole for said specific transistor, and a distance from said contact hole of said additional diode to the base-emitter junction of said specific transistor is longer than a diffusion distance of minority carriers in said base layer, so that said portion of said base layer of said specific transistor serves as another semiconductor layer of said additional diode.

2. The semiconductor device according to claim 1, wherein said Darlington structure includes a two stage Darlington structure formed of two transistors, and said additional diode is connected between the base layer and the collector layer of the first stage transistor of said two stage Darlington structure.

3. The semiconductor device according to claim 1, wherein said Darlington structure includes a three stage Darlington structure formed of three transistors, and said additional diode is connected only between the base layer and the collector layer of the first stage transistor of said three stage Darlington structure.

4. The semiconductor device according to claim 1, wherein said Darlington structure includes a three stage Darlington structure formed of three transistors and two additional diodes are respectively connected between base layers and collector layers of the first- and second-stage transistors of said three stage Darlington structure.

5. The semiconductor device according to claim 1, wherein said transistors and said additional diode are formed in different regions of a semiconductor substrate and the distance from the contact hole of said additional diode to the base emitter junction of said specific transistor is 50 μm or more.

6. The semiconductor device according to claim 1, wherein said transistors and said additional diode are formed in different regions of a semiconductor substrate and a base diffusion depth of the base layer of said specific transistor, at a portion exposed by said contact hole of said additional diode, is deeper, by a predetermined amount, than the diffusion depth of the other portions of said base layer of said specific transistor.

7. The semiconductor device according to claim 1, wherein said Darlington structure includes a 2-stage Darlington structure formed of two transistors and said additional diode is connected between the base layer and the collector layer of the first-stage transistors of said 2-stage Darlington structure, and a base diffusion depth of the base layer of said specific transistor, at a portion exposed by said contact hole of said additional diode, is deeper, by a predetermined amount, than the diffusion depth of the other portions of said base layer of said specific transistor.

8. The semiconductor device according to claim 1, wherein the distance from the contact hole of said additional diode to the base-emitter junction of said specific transistor is 50 μm or more.

9. The semiconductor device according to claim 1, wherein a base diffusion depth of the base layer of said specific transistor, at a portion exposed by said contact hole of said additional diode, is deeper, by a predetermined amount, than the diffusion depth of the other portions of said base layer of said specific transistor.

10. The semiconductor device according to claim 1, wherein said Darlington structure includes a 2-stage Darlington structure formed of two transistors, and said additional diode is connected between the base layer and the collector layer of the first-stage transistor of said 2-stage Darlington structure and a base diffusion depth of the base layer of said specific transistor, at a portion exposed by said contact hole of said additional diode, is deeper, by a predetermined amount, than the diffusion depth of the other portions of said base layer of said specific transistor.

11. The semiconductor device according to claim 1, wherein said additional diode is connected between the base layer and the collector layer of at least one transistor of said transistors of the Darlington structure, except the last-stage transistor of the Darlington structure.

* * * * *